United States Patent [19]
Schmitt

[11] 4,302,668
[45] Nov. 24, 1981

[54] VARIABLY BIASED PHOTOELECTRIC CIRCUIT

[75] Inventor: Walter Schmitt, Traunreut, Fed. Rep. of Germany

[73] Assignee: Dr. Johannes Heidenhain GmbH, Traunreut, Fed. Rep. of Germany

[21] Appl. No.: 96,619

[22] Filed: Nov. 23, 1979

[30] Foreign Application Priority Data

Dec. 25, 1978 [DE] Fed. Rep. of Germany ....... 2852530

[51] Int. Cl.³ ............................................. H01J 40/14
[52] U.S. Cl. ..................................... 250/209; 250/210
[58] Field of Search ........... 250/208, 209, 210, 214 R, 250/231 SE, 237 G

[56] References Cited
U.S. PATENT DOCUMENTS

3,850,530 11/1974 Uno et al. ...................... 250/208 X
4,184,071 1/1980 Fryer et al. ................. 250/237 G X

OTHER PUBLICATIONS

Siemens, "Neue fotoelektrische Bauelemente in Anwendungsschaltungen", Technische Mitteilungen Halbleiter, pp. 11 and 12.

*Primary Examiner*—David C. Nelms
*Assistant Examiner*—Edward P. Westin
*Attorney, Agent, or Firm*—Hume, Clement, Brinks, Willian & Olds, Ltd.

[57] ABSTRACT

A photoelectric circuit is provided with a differential amplifier having two inputs. First and second photosensitive elements and resistors are connected in parallel to each of the two inputs of the differential amplifier, respectively. A second amplifier is provided with its input coupled in parallel to a third resistor and a third photosensitive element. The output of the second amplifier is applied as a bias voltage to each of the three photosensitive elements in parallel.

8 Claims, 4 Drawing Figures

FIG. 1
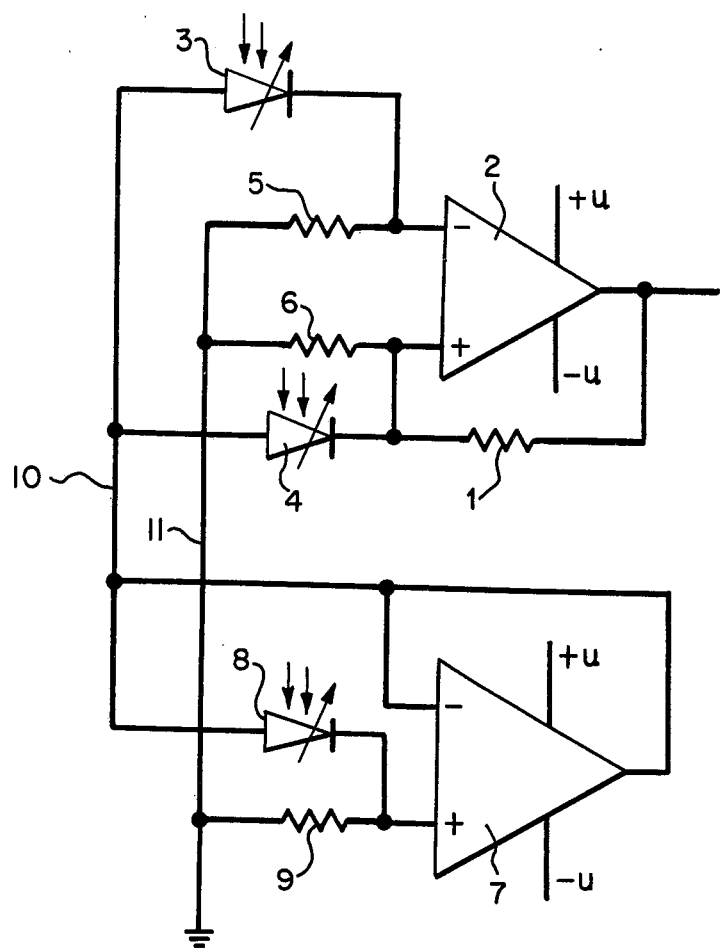
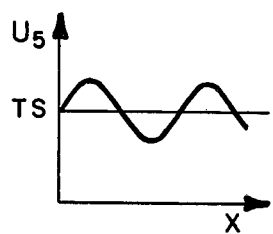
FIG. 2a
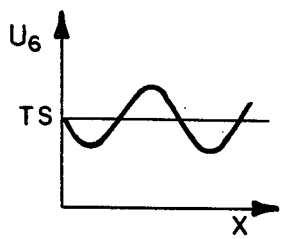
FIG. 2b
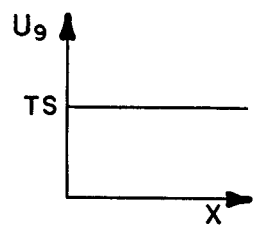
FIG. 2c

VARIABLY BIASED PHOTOELECTRIC CIRCUIT

BACKGROUND OF THE INVENTION

This invention relates generally to photoelectric circuits, and is particularly useful in connection with incremental or absolute digital position measuring systems. In particular, this circuit relates to an improvement in photoelectric circuits of the type in which photosensitive elements are connected to each of the two inputs of a differential amplifier, and in which in each case a resistance is connected in parallel with the photosensitive element.

Photoelectric circuits of this general type have been used, for example, in incremental or absolute digital length or angle measuring systems. In this application the photosensitive elements are used to transduce the light flux modulated by the superimposed divisions of a scale and a scanning plate into electrical signals that are processed to determine the relative position of the scanning plate with respect to the scale.

One such photoelectric circuit is disclosed in the Siemens publication, "Technische Mitteilungen Halbleiter: Neue Fotoelektrische Bauelemente in Anwendingsschaltungen", Order No. B 114/1062/47120. On Pages 11 and 12 of this publication there is shown a known path-voltage transducer, in which to each of the two inputs of a fed-back differential amplifier there is connected a photosensitive element, and in which in each case there is circuited a resistance in parallel to the photosensitive element. This arrangement is well suited for fabrication as a monolithic arrangement of photosensitive elements, since each photosensitive element of the circuit includes a common electrode. One disadvantage of this circuit is its relatively large dark current caused by the bias voltage on the photosensitive elements.

SUMMARY OF THE INVENTION

The present invention is directed to an improved photoelectric circuit of the general type described above which provides a low dark current, permits monolithic fabrication of the photosensitive elements and, in addition, is suited for use in applications in which the brightness of the illumination is subject to change.

According to this invention, a photoelectric circuit is provided with differential amplifier means having two inputs. First and second photosensitive elements and resistors are connected in parallel to each of the two inputs of the differential amplifier means, respectively. A second amplifier is provided with its input coupled in parallel to a third resistor and a third photosensitive element. The output of the second amplifier is applied as a bias voltage to each of the three photosensitive elements in parallel. Further developments of the invention are set forth in the claims.

The invention, together with further objects and attendant advantages, will be best understood by reference to the following detailed description and the accompanying drawings.

BRIEF DESCRIPTION OF THE DRAWINGS

FIG. 1 shows a presently preferred embodiment of the photoelectric circuit of this invention.

FIGS. 2a, 2b and 2c graph the input voltages at three of the four inputs of the differential amplifiers shown in FIG. 1 as a function of displacement.

DETAILED DESCRIPTION OF PREFERRED EMBODIMENTS

Referring now to the drawings, the photoelectric circuit shown in FIG. 1 includes a first differential amplifier 2 having the two conventional inputs. The noninverting input of this amplifier 2 is coupled to the output of the amplifier 2 via a resistor 1. Both the inverting and noninverting inputs of the amplifier 2 are connected to a common point via resistors 5,6, respectively. A photosensitive element 3,4 is connected to each of the inputs of the amplifier 2 in parallel with the resistors 5,6, respectively. A second differential amplifier 7 is provided with a resistor 9 and a photosensitive element 8 connected in parallel to the noninverting input of this amplifier 7. The output of this amplifier 7 is connected in the first place via conductor 10 with the three photosensitive elements 3,4,8, and in the second place, directly to the inverting input of the amplifier 7. Thus, all three of the photosensors 3,4,8 have a common electrode. The three resistors 5,6,9 are further connected via a conductor 11 with a potential that lies between the supply voltages $+U, -U$ for the differential amplifiers 2,7. This potential can, for example, be at ground potential, as shown.

The photosensitive elements 3,4 are illuminated in push-pull, or 180° out of phase, while the photosensitive element 8 is acted upon with constant light. The structure which provides this illumination forms a part of the measuring instrument. Such structure is well known to those skilled in the art and does not form a part of this invention. Accordingly, no detailed description of this structure will be provided here.

By way of example, in a measuring instrument including a light source, a grid scale, and a scanning plate, the photosensitive element 8 can be placed in direct sight of the light source such that it is subjected to constant illumination. The photosensitive elements 3,4 can be placed such that both the grid scale and the scanning plate are between the light source and the photosensitive elements 3,4. Preferably, the photosensitive elements 3,4 are positioned such that they are illuminated 180° out of phase, in push-pull, as the scanning plate moves along the grid scale. In this arrangement all three photosensors 3,4,8 are preferably illuminated by the same light source, and variations in intensity of the source are, therefore, compensated for by the photosensitive element 8. Variable apertures can be used in front of each of the photosensitive elements 3,4,8 to aid in balancing the circuit, as will be described below.

The photoelectric circuit of FIG. 1 operates as follows: Each of the photosensitive elements 3,4, when illuminated in the push-pull manner, generates a photocurrent which induces a voltage variation $U_5, U_6$, on the resistors 5,6, respectively. These voltage variations, which are graphed in FIGS. 2a and 2b, are applied to the inputs of the differential amplifier 2. FIG. 2a represents the voltage $U_5$ as a function of the measuring path X as applied to the inverting input of amplifier 2 and FIG. 2b represents the voltage $U_6$ as a function of the measuring path X as applied to the noninverting input of the differential amplifier 2. These voltages $U_5, U_6$ are phase-shifted by 180° with respect to one another in the case of ideal photosensitive elements. The trigger threshold voltage TS is determined by the point at which the voltages $U_5, U_6$ are equal, and is represented in FIGS. 2a, and 2b by the horizontal straight lines TS.

Currently available photosensitive elements deviate from the ideal behavior described above. Because leakage currents often differ from photosensor to photosensor, the voltages $U_5, U_6$ are in general shifted with respect to one another; this results in a shift in the trigger voltage TS. The circuit of FIG. 1 largely overcomes this disadvantage in that the photocurrent generated by the constant light illumination on the photosensitive element 8 brings about a voltage drop $U_9$ (shown in FIG. 2c) which is applied to the noninverting input of the differential amplifier 7, the output of which is applied via the conductor 10 to the anodes of the photosensitive elements 3,4,8.

The photocurrents of the photosensitive elements 3,4,8 are now balanced in such a way that the voltage $U_9$ on the anodes of the photoelectric elements 3,4 is equal to the average voltages $U_5U_6$, i.e., the trigger threshold voltage TS. In this manner the photosensors 3,4 provide very low dark currents. This balancing can take place in a manner not represented by the means that the cross sections of the light rays falling on the photosensitive elements 3,4,8 are varied by suitable means or that resistances 5,6,9 are embodied as variable resistors.

The circuit arrangement of this invention has the further advantages of a large band width and an ability to compensate for differing illumination relationships. In addition, it is well suited for the fabrication of the photosensitive elements 3,4,8 on a monolithic substrate, since the photoelectric elements 3,4,8 have a common electrode.

Of course, it should be understood that various changes and modifications to the presently preferred embodiments described herein will be apparent to those skilled in the art. For example, any desired impedance converter with an amplification of +1 could be used instead of the differential amplifier 7. Such changes and modifications can be made without departing from the spirit and scope of the present invention, and without interfering with its advantages. It is, therefore, intended that all such changes and modifications be covered by the following claims.

I claim:

1. In a photoelectric circuit comprising a first differential amplifier having first and second input terminals and an output terminal, first and second resistors, each having first and second terminals, and first and second photosensitive elements, each having first and second terminals; wherein the first terminals of the first resistor and the first photosensitive element are connected to a first conductor which is in turn connected to the first input terminal; and wherein the first terminals of the second resistor and the second photosensitive element are connected to a second conductor which is in turn connected to the second input terminal; the improvement comprising:

a second amplifier having an input terminal and an output terminal;

a third resistor having first and second terminals;

a third photosensitive element having first and second terminals;

means for connecting the first terminals of the third resistor and the third photosensitive element to a third conductor which is in turn connected to the input terminal of the second amplifier;

means for supplying voltages to the second terminals of the first, second and third resistors; and means for connecting the second terminals of the first, second and third photosensitive elements to a fourth conductor which in turn is connected to the output terminal of the second amplifier in order to provide a bias signal to the first, second and third photosensitive elements.

2. A photoelectric circuit comprising:

a first differential amplifier having first and second input terminals and an output terminal;

a second amplifier having an input terminal and an output terminal;

first, second and third photosensitive circuits, each comprising a respective photosensitive element connected to a respective resistor at a respective node;

means for connecting the nodes of the first and second photosensitive circuits to the first and second input terminals, respectively, of the first amplifier;

means for connecting the node of the third photosensitive circuit to the input terminal of the second amplifier;

means for providing the signal generated at the output terminal of the second amplifier as a bias signal to the photosensitive elements of the first, second and third photosensitive circuits; and means for supplying voltages to the respective resistors.

3. The invention of claim 1 or 2 further comprising means for illuminating the first and second photosensitive elements in push-pull and means for illuminating the third photosensitive element with substantially constant light.

4. The invention of claim 3 wherein the means for illuminating the first and second photosensitive elements and the means for illuminating the third photosensitive element comprise the same light source.

5. The improvement of claim 1 or 2 wherein the first input terminal of the first differential amplifier is a noninverting input terminal and further, wherein the improvement includes a fourth resistor connected between the noninverting input terminal and the output terminal of the first differential amplifier.

6. The improvement of claim 1 or 2 further including means for individually balancing each of the photosensitive elements.

7. The improvement of claim 3 further including means for individually balancing each of the photosensitive elements.

8. The improvement of claim 4 further including means for individually balancing each of the photosensitive elements.

* * * * *